United States Patent
Wright et al.

[11] Patent Number: 5,017,876
[45] Date of Patent: May 21, 1991

[54] CORONA CURRENT MONITORING APPARATUS AND CIRCUITRY FOR A.C. AIR IONIZERS INCLUDING CAPACITIVE CURRENT ELIMINATION

[75] Inventors: William S. Wright, Green Lane; Mark Blitshteyn, Lansdale, both of Pa.

[73] Assignee: The Simco Company, Inc., Hatfield, Pa.

[21] Appl. No.: 428,604

[22] Filed: Oct. 30, 1989

[51] Int. Cl.⁵ .............................................. G01N 27/62
[52] U.S. Cl. ................................... 324/464; 324/459; 55/105
[58] Field of Search ............... 324/455, 452, 459, 464, 324/466, 468, 683, 83 R, 709, 409–411, 394, 399; 55/105; 361/230; 307/511; 328/155

[56] References Cited
U.S. PATENT DOCUMENTS 3,823,372  7/1974  Hanson et al. ................. 324/464 X
4,851,761  7/1989  Matsuno ....................... 324/709 X Primary Examiner—Kenneth Wieder
Assistant Examiner—Jack B. Harvey
Attorney, Agent, or Firm—Stanley Bilker

[57] ABSTRACT

Apparatus for measuring corona current in high voltage A.C. ionizers uses an electrical sensor adjacently spaced from at least one of the discharge electrodes and coupled to electronic circuitry for separating capacitive current from the corona current. In one mode, the capacitive current component is measured directly by a first sensor adjacently spaced from one discharge electrode whose corona current flow to such electrode is either obstructed or squelched entirely while a second sensor monitors total current. The signals from the two sensors are electrically subtracted when applied to opposing inputs of a differential amplifier to provide an output signal proportional to just corona current. In a second mode, a measure of corona current is again provided by electrically subtracting from a total current signal input to a differential amplifier a signal equal to the capacitive current component. However, while the total current signal in this case is again obtained by a single sensor adjacently spaced with respect to one electrode, the capacitive current signal is generated independently of a sensor through electronic circuitry coupled to the A.C. line voltage. In a third mode, a signal from a single sensor adjacently spaced from a single discharging electrode is applied to phase discriminator circuitry that passes only selected portions of the sensor-generated signal which contain equal positive and negative segments of the capacitive current component so that the average capacitive current signal thereof is equal to zero, whereby upon filtering the capacitive current signal will cancel out and leave remaining only that component proportional to corona current.

27 Claims, 4 Drawing Sheets

CORONA CURRENT MONITORING APPARATUS AND CIRCUITRY FOR A.C. AIR IONIZERS INCLUDING CAPACITIVE CURRENT ELIMINATION

BACKGROUND OF THE INVENTION

1. Field of the Invention

This invention relates to A.C. air ionizers, and more particularly relates to electrical apparatus and circuitry for measuring corona current in the ion stream being emitted from the discharging electrodes of such air ionizers in order to evaluate the efficiency thereof at any time.

Corona discharge electrodes operating on alternating current are utilized in a variety of air ionizing devices for generating both positive and negative ions, such as static eliminators or neutralizers, corotrons of electrostatic copiers, electrostatic precipitators, and the like. Typical electrical A.C. air ionizing devices are driven by high voltages ranging from about 3,000 volts to 10,000 volts at frequencies from about 50 Hz to 20 KHz by means of a high voltage transformer whose output is coupled to one or more sharp electrodes in the form of points or small diameter wire positioned in the proximity of ground. Corona current is only generated when the voltage on the discharge electrodes exceeds the corona onset level, and there is no corona current when the point voltage is below that threshold. The average corona current for a given corona electrode is a function of the voltage applied to the corona electrode.

A typical wave form for total current (capacitive current plus corona current) with respect to time is shown in FIG. 1, the capacitive (or displacement) current which is substantially sinusoidal in configuration being always present during operation and 90° out of phase with the A.C. voltage applied to the discharge electrodes.

When the voltage applied to the discharge electrode exceeds the corona threshold level, the corona current will start flowing and continue to flow until the voltage on the electrode decreases below the threshold level. The pulse of corona current normally begins about the time that the sinusoidal waveform of the displacement or capacitive current reaches its peak value. The corona threshold or onset level is a function of the sharpness of the discharge electrode points, their distance from a proximity ground, the atmosphere of operation, and the degree of contamination of such discharge electrodes.

As is well known, corona electrodes tend to attract contamination from the environment, especially dust. As the electrodes become covered with contamination, their corona characteristics change—usually, the corona current diminishes, and the air ionizers become less efficient so as to become ultimately ineffective. This condition is quite difficult to detect, particularly in the case of air ionizers where a strong signal generated by the field from the corona electrodes via the capacitance of the air masks the signal generated by the ion flow itself.

2. Prior Art

In U.S. Pat. No. 4,757,422 to Bossard, a detector screen is interposed in the ion path within the housing at the ion exit port for the purpose of capturing some of the ions produced by the electrodes. The detection screen is of conductive material and held at virtually ground level by means of a low impedance operational amplifier circuit. In addition, a similar screen coupled directly to ground is positioned between the ion generating electrodes and the detection screen in order to terminate the electric field lines emanating from the electrodes.

However, this arrangement has the disadvantage that only air ionizers using fans or blowers to propel ions past the grounded screen into the environment can be employed. That is ionizers which do not use blowers or fans will have all generated ions captured by the shielding screens, hence being rendered ineffective. Secondly, for a shielding screen to be effective in eliminating the field influence, such a screen must be quite dense which will result in a significant portion of the ions generated being captured, even should a blower be utilized to extend the range by propelling ions. Thirdly, in the instance of static eliminators which use the field of the charged object for neutralization, the shielding screen again will mask the object field and inhibit ions from reaching the charged surface.

SUMMARY OF THE INVENTION

It is therefore an object of this invention to provide an apparatus and circuit for measuring the ion or corona current generated by an A.C. air ionizing device with minimal interference in the production of such ions or in the delivery thereof toward the intended target.

Another object of this invention is to provide an air ionizer having means for separating the corona current from the total current (i.e. corona or ionization current plus capacitive or displacement current) and monitoring this corona current as a function of the efficiency of the ionizer output.

Yet another object of this invention is to provide a means for determining the efficiency of an air ionizer at any time without materially intruding upon the production of air ions.

Other objects of this invention are to provide an improved device of the character described, which is easily and economically produced, sturdy in construction and both highly efficient and effective in operation.

According to the present invention, there is provided a method for separating the corona current component from the capacitive current component in the total ground plane current of the A.C. ionizing device, the total ground plane current being generally the sum of the corona current and capacitive current at any time. The wave form for the total current with respect to the ground plane is shown in FIG. 1. When the corona current component is isolated, it may be continuously measured and its level monitored for the purpose of assessing the efficiency of the air ionizer.

In the present invention, sensing means are provided for detecting the total current produced at one discharge electrode by the A.C. high voltage source and generating an A.C. signal proportional to the sum of the capacitive and corona current components developed. Then, a signal proportional to just the corona current is obtained by eliminating the capacitive current from the total current. The capacitive current is obtained by one of two modes: (1) direct measurement or (2) by generating a signal equal to the capacitive current component. In a third mode, the capacitive current component is electronically cancelled in the signal corresponding to the total current.

In the first mode, the capacitive current signal is derived directly either by obstructing the flow of corona current being generated by one discharge electrode to a sensing element or by entirely preventing (squelching) the generation of corona current by one discharge electrode or a portion thereof with respect to a sensing element.

Corona current to a sensing element may be blocked or disrupted by encapsulating said sensing element in an insulative coating. The generation of corona current may be entirely inhibited in connection with a discharge electrode by increasing the radius of curvature of the tip of such an electrode to the extent that at the high voltage imposed thereon breakdown of the air gap does not occur or by incorporating an insulative layer about such an electrode to the same effect.

In all embodiments of the first mode, a pair of sensors are adjacently spaced with respect to one of the discharge electrodes, and each sensing element is coupled to opposing inputs of a differential amplifier. In one arrangement, one sensor is insulated to disrupt the flow of corona current thereto, thus delivering a signal which is representative of just capacitive current (i.e. corona current to that electrode being obstructed). The other electrode is uninsulated and thereby provides a signal representing the total ground plane current at any time (i.e. capacitive current in addition to ionizing current when corona is effected). The differential amplifier provides an output signal that is proportional to just the corona current which upon rectification is a measure thereof.

Other embodiments of the first mode involve the squelching of the corona current at the electrode being monitored, the discharge electrode being so constructed and arranged so as not to generate any corona current at all toward one sensing element. Neither of the pair of sensing elements employed is insulated.

In one arrangement, the point of one discharge electrode has a radius of curvature sufficiently large as to prevent the generation of corona current therefrom so that the sensing element adjacent thereto delivers a signal which is proportional to just capacitive current. The other sensing element is adjacently spaced from a normal pointed electrode and provides a signal representing the total ground plane current at any time. As before, each of the sensing elements is coupled to opposing inputs of a differential amplifier and the output signal therefrom is proportional to corona current alone which upon rectification is a measure of the corona current.

In another embodiment of the first mode, the point of the electrode which is being monitored for capacitive current is encapsulated within an insulative covering whereby at the high voltage imposed no corona current is generated, the pair of sensing elements again being input to a differential amplifier that subtracts the capacitive current signal from the total current signal such that an output signal proportional to corona current is produced.

In still another embodiment when an elongated wire conductor forms the discharge electrode, a pair of conductive sensing elements are longitudinally spaced from each other along the axis of the wire. One sensing element encircles an insulated portion of the wire in suppression of corona current while the second sensing element encircles an uninsulated portion of the wire and monitors the total of capacitive and corona current. These individual signals are again delivered to opposite inputs of a differential amplifier whereupon the capacitive signal is subtracted from the total signal to provide an output proportional to just corona current.

In the second mode, a single sensor adjacently spaced from one discharge electrode is directly coupled to one input of a differential amplifier to provide a measure of the total current while a second input of the differential amplifier is coupled to the A.C. line voltage through an electronic circuit which by way of appropriate phase adjustment and attenuation generates a signal equal to the capacitive current in the total current signal. The electronic circuit includes a capacitance and resistance network for attenuating the capacitive current signal and adjusting the phase thereof until it is equal to the capacitive current component obtained from the first sensor. Subtraction of the capacitive current from the total current by means of the differential amplifier will as before provide an A.C. corona current signal at the output of said differential amplifier which upon rectification again produces a D.C. current signal proportional to the corona current.

In the third mode of this invention, a single sensor is adjacently spaced from a single discharge electrode and the total current signal therefrom (capacitive plus corona current at any time) is applied to the input of a phase discriminator so adjusted to pass a selective portion of each cycle of said total current signal. By selecting portions of the signal lying between each consecutive pair of positive and negative peaks (or conversely, negative and positive peaks) of the capacitive current signal wave form, so that these portions contain equal segments of the capacitive current component, upon filtering, the capacitive current component will cancel itself out leaving a D.C. signal that is related to positive (or negative) corona current, either of which is a measure of corona current emitted by the A.C. ionizer.

Where the selected signal portion is a 180° portion of the cycle lying intermediate each consecutive pair of such corresponding positive and negative peaks (or alternatively, adjacent negative and positive peaks) of the capacitive current signal wave form and having a zero average capacitive current component, the signal passed will contain the entire positive (or negative) corona current component. After filtering, the capacitive current component will cancel itself out so that the resultant D.C. signal output in this case will be actually proportional to positive (or negative corona) current. In either case, the respective positive or negative corona current monitored in a measure of the corona current emitted by the A.C. air ionizer.

Where the portion of the signal cycle selected is less than 180° while greater than 0°, but still having an average capacitive current component equal to zero, the selected portion of the signal waveform will contain a fractional part of the positive (or negative, whichever is the case) corona current component so that the resultant D.C. signal after filtering will be related to the corresponding positive or negative corona current and be a measure of the corona current level of the A.C. air ionizer.

BRIEF DESCRIPTION OF THE FIGURES

With the above objects in view, this invention consists of the details of construction and combination of parts as will be more fully understood from the following detailed description when read in conjunction with the accompanying drawings in which.

DETAILED DESCRIPTION

Figure 1:
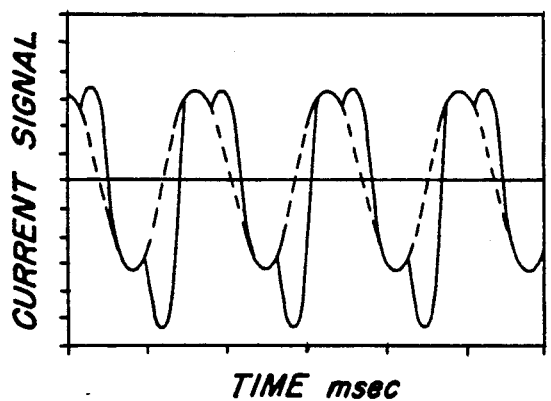
FIG. 1 is a graphical representation of the prior art wave form with respect to time for total electrode current of a typical A.C. air ionizer.

Referring now in greater detail to the drawings in which similar reference characters refer to similar parts, we show in combination with a high voltage A.C. air ionizer, generally designated as A, a corona current monitor having sensing means B adapted to isolate the corona current emitted at the air ionizer discharge electrodes from the capacitive or displacement current imposed on said electrode by an A.C. high voltage power source.

The air ionizer A may be any static eliminator or neutralizer, corotron or electrostatic precipitator in which one or more discharge electrodes 10 are adjacently spaced from a conductive casing 12, normally at ground potential, and across which is coupled a high voltage A.C. power source 14 so as to cause emission of positive and negative ions in he air gap therebewteen. The discharge electrodes 10 are usually in the form of conductive tapered pins or pointed needles, but can be made of thin diameter longitudinally extending wire, or short lengths of snipped wire, sharp blades or a plurality of brush bristles, or the like. Examples of various types of static eliminators are shown in U.S. Pat. Nos. 3,137,806 (direct coupled static bar), 3,120,626 (shockless static eliminator), 3,156,847 (ionizing air gun), 4,188,530 (air ionizing extended range blower). The A.C. power supply 14 generally consists of a high voltage transformer having a secondary output in the range of 3,000 to 15,000 volts at frequencies of from about 50 Hz to 20 KHz. The ground member 12 may be a conductive housing which partially surrounds the electrodes 10 or may be a proximity ground when no casing is employed.

When the A.C. high voltage from the power source 14 is applied across the electrodes 10 and the adjacently spaced ground 12, the wave form of the current follows the voltage curve by 90° and exhibits a configuration substantially identical to the applied voltage, usually sinusoidal, but having pips or blips at the positive and negative crests thereof (the latter defining the ionizing or corona current when the corona onset or threshold is exceeded). A representation of a typical total current versus time curve at the discharge electrodes 10 for a conventional air ionizer is shown in FIG. 1. The capacitive current and corona current are basically 90° out of phase, the total ground plane current being generally the sum of the corona current and the capacitive current. The broken lines depict the capacitive current component of a total current signal.

Figure 2:
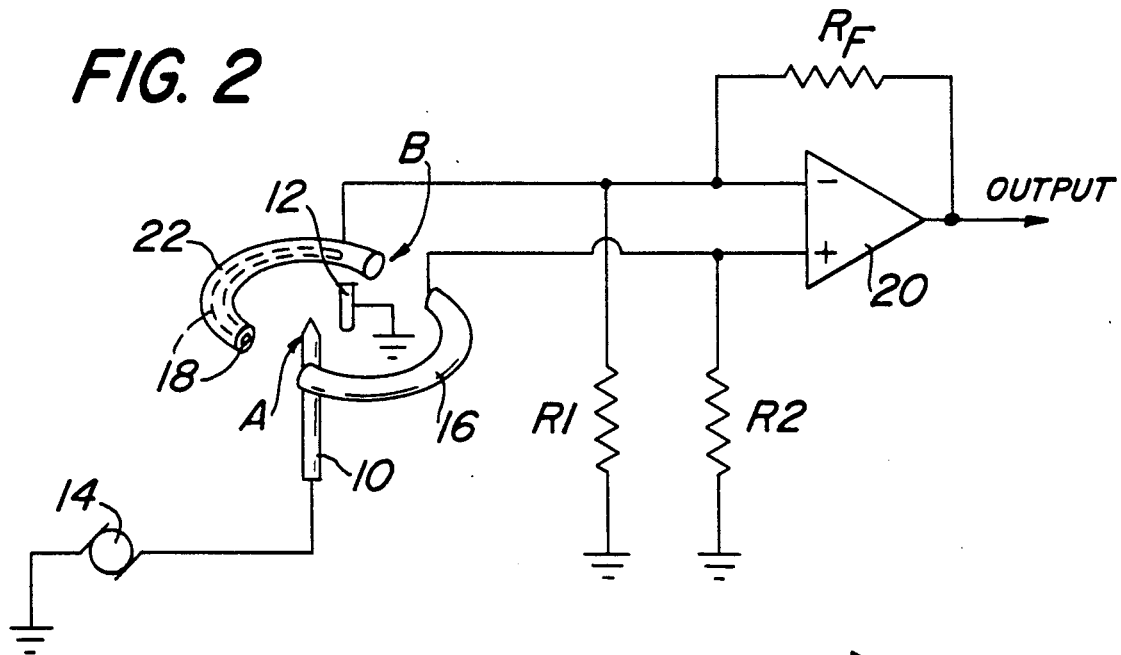
FIG. 2 is a schematic circuit diagram of a first embodiment of this invention wherein corona current of an A.C. air ionizer is monitored by detecting total current of one discharge electrode and then, after directly measuring the capacitive current component, electrically subtracting the capacitive current from the total current.

Referring now to FIG. 2, one embodiment of the sensor B for isolating or separating the corona current from the capacitive or displacement current comprises a pair of conductive elements 16 and 18, each being substantially half-toroidal in shape (one-half of a doughnut) and adjacently spaced around the point of one of the air ionizer electrodes 10. Although it is preferable that the sensing elements 16 and 18 are parts of a ring so that all portions thereof are equidistant from the locus of the point, these elements may also be plates or disks. A preferred spacing of the sensing elements 16 and 18 from the points 10 should be a distance of from about 2 mm to 20 mm. The sensing element 16 is directly coupled to one input (positive) of a differential amplifier 20 across a resistor R2, for example. The element 18 is encapsulated within an insulating covering 22, and is coupled directly to the (negative) input of differential amplifier 20 across resistor R1, the insulation 22 being sufficient to prevent corona current from passing from the point 10 to sensing element 18.

As a result of the obstruction of the corona current to sensing element 18 by the insulation 22, the signal voltage produced by the capacitive current across R1 is in effect a function of pure displacement current. On the other hand, since ionization or corona current does pass from the point 10 to sensing element 16, the voltage across resistor R2 will be a function of the sum total of capacitive current plus corona current. When these two signals are applied to the opposing inputs of differential amplifier 20, the capacitive current signal component will be electrically subtracted from the total current, wherein the resulting signal output from the differential amplifier (i.e. the difference) is proportional to just the corona current component. The values for the resistors R1, R2 and feedback resistor R, are selected in a manner well known to those skilled in the art so as to generate appropriate operating signal voltages in connection with the differential amplifier 20. A typical corona current wave form from the differential amplifier 20 is illustrated graphically in FIG. 7. When rectified and filtered and monitored in a conventional manner, such signal is a measure of such corona current.

Figure 3:
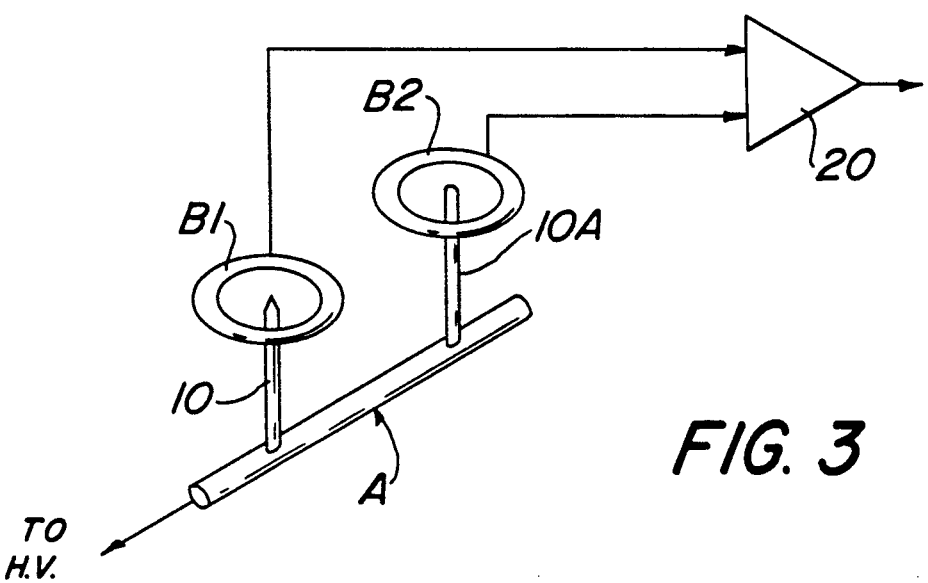
FIG. 3 is a schematic circuit diagram of another embodiment of this invention in which the capacitive current component of total current of an A.C. air ionizer is directly detected prior to electrically subtracting the capacitive current signal from the total current.

Referring now to FIG. 3, there is shown another embodiment of the instant invention wherein instead of blocking the flow of corona current to the capacitive current monitoring sensor 18 by means of insulation 22, the electrode being monitored is so constructed and arranged as to prevent entirely the generation of any corona whatsoever from such electrode when high voltage is applied to the air ionizer A. In this mode, electrode 10A has a spherical tip of sufficiently large radius of curvature as will effectively squelch any corona emission at all therefrom. An uninsulated conductive sensor B1 in the form of a ring encircles pointed discharge electrode 10 while a second ring-shaped uninsulated conductive sensor B2 is concentrically about the spherically configured discharge electrode 10A. The sensing element B1 oriented about the pointed electrode 10 detects the total current of said electrode, which includes both corona current as well as capacitive current, and applies a first signal input to a differential amplifier 20. However, the sensing element B2 encircling the spherical electrode 10A, with respect to which no corona current is emitted since it is non-corona-generating, provides a signal that is a measure of merely the capacitive current component alone. When the latter signal is applied as the second input to the differential amplifier, electrical subtraction of the capacitive current signal from the total current signal produces at the output thereof a signal proportional to corona current alone.

Figure 4:
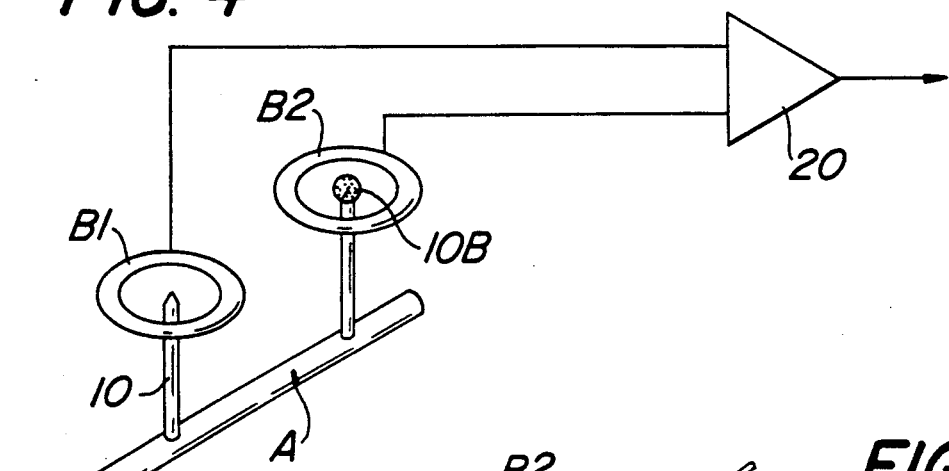
FIG. 4 is a schematic circuit diagram of yet another embodiment of this invention in which the capacitive current component of total current is directly detected prior to electrical subtraction.

Referring next to FIG. 4, there is shown another embodiment of the first mode of this invention wherein an electrode having an insulated tip 10B is inhibited from emitting corona as the high voltage is applied to the air ionizer A. Ring sensor B2 encircling the insulated electrode 10B does not pick up any corona current signal since corona is effectively prevented by the squelching action of the insulation as the A.C. ionizer high voltage is applied to this insulated electrode. Therefore, ring sensor B2 detects a signal proportional to the capacitive current component alone. Ring sensor B1 concentrically spaced about the point of corona emitting discharge electrode 10 provides a signal that is the sum of both the capacitive and corona current components. Accordingly, when the total current signal from sensor B1 and the capacitive current signal from sensor B2 are applied as opposing inputs to the differential amplifier, the electrically subtracted output is again a measure of corona current alone.

Figure 5:
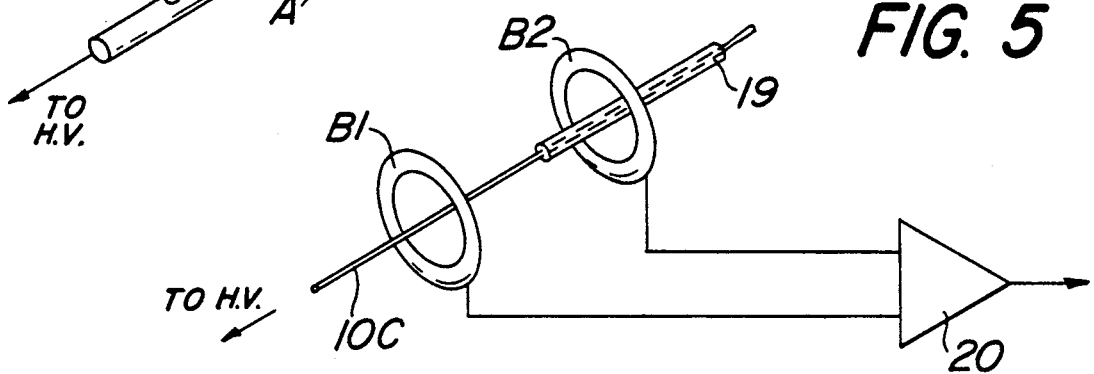
FIG. 5 is a schematic circuit diagram of still another embodiment of this invention for directly detecting the capacitive current component of total current in an A.C. air ionizer having a continuous wire discharge electrode.

In FIG. 5, there is shown an air ionizer employing a continuous fine wire element 10C as the discharging electrode. A pair of conductive ring-shaped sensing elements B1 and B2 are axially spaced from each other in concentric disposition about the wire electrode 10C. One of the ring sensors B2 encircles an insulated portion 19 covering the wire electrode 10C such that the insulation sheath 19 prevents any corona from being generated underneath the encircling sensing element B2 whereby said sensor detects only the capacitive current component at the underlying insulated portion. The ring sensor B1 surrounding the portion of the wire 10C which is uninsulated provides a first input to the differential amplifier which is a measure of total current while the sensor B2 encircling the insulated covering 19 about the wire 10C furnishes a second input which is a measure of just the capacitive current component. Electrically subtracting the two signals via the differential amplifier yields an output which is again proportional to the corona current component.

Figure 6:
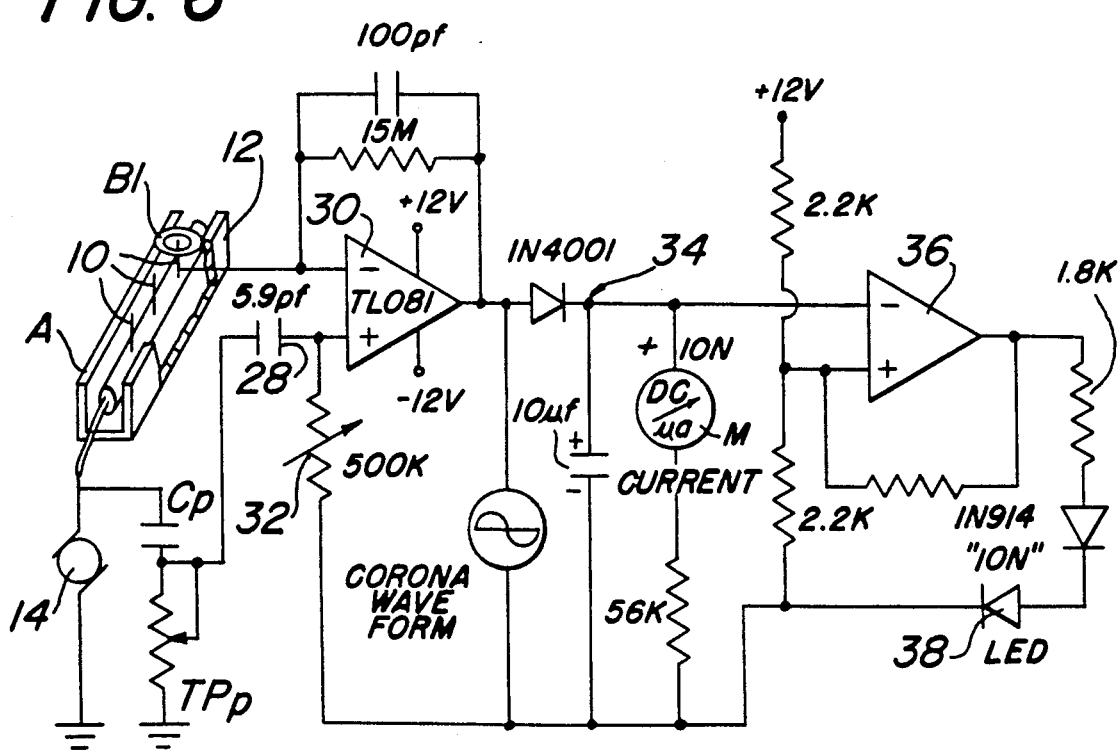
FIG. 6 is a schematic circuit diagram of a yet still another embodiment of this invention wherein a capacitive current signal equal to the capacitive current component of total current is generated by independent electronic circuitry coupled to the A.C. voltage operating the A.C. air ionizer.

Referring now to FIG. 6, we show another mode of the instant invention wherein rather than directly picking off the capacitive current signal by means of a sensing element, a signal equal to the capacitive current component of the total current is independently generated by coupling one input of a differential amplifier 30 through electrical circuitry to the A.C. line voltage. In general, the electrical circuitry for generating the capacitive current signal constitutes a direct or capacitive connection to the A.C. line voltage by way of capacitor 28 and phase adjusting network comprising capacitor $C_p$ and adjustable potentiometer $TP_p$.

The values of $C_p$ and $TP_p$ are so selected to provide proper phase adjustment and attenuation. Potentiometer 32 provides attenuation of the signal whereby it is equal to the capacitive current component of the total current detected by sensor B1. The sensor B1 is again in the form of an uninsulated conductive ring entirely encircling one of the air ionizer discharge electrodes 10. This sensing element B1 as in the case of the first mode detects the total of both capacitive as well as corona current. The signal from the ring sensor B1 is applied to the negative input of a TL081 integrated circuit hooked up as an differential amplifier 30 while the generated capacitive current signal is coupled to the positive input of amplifier 30. When the latter signal is equi-balanced against the capacitive current portion of total current signal from the sensor B1, the differential amplifier 30 will null the capacitive signal and provide an output signal which is again proportional to corona current.

Figure 7:
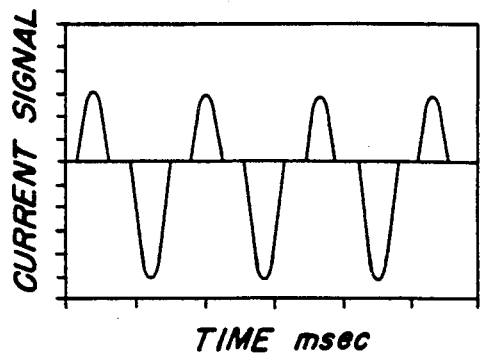
FIG. 7 is a graphical representation of the corona current signal appearing at the output of the differential amplifier for the various embodiments of this invention shown in FIGS. 2 through 6.

The output wave form of the differential amplifier 30 which electrically substracts the independently generated capacitive signal input from the total current signal input detected by sensor B1 is also shown in FIG. 7. This wave form is the same as the output wave forms from differential amplifier 30 which electrically subtracted the directly detected capacitive current signal from the sensed total current signal input produced by the embodiments set forth in FIGS. 2, 3, 4 and 5.

After the corona current has been separated from the capacitive current at the output of differential amplifier 30, the transient corona signal can be rectified through diode circuit 34 and applied to the (−) input of comparator 36, the other input to which can be controlled by adjusting the threshold that activates visual indicator 38 when corona current falls below a predetermined level.

Because capacitive current is a function of the capacitance of an ionizing electrode to ground, its value can be treated as a constant for all practical purpose. Since the capacitive signal can be picked up through a capacitive coupling, and adjusted to the proper phase and amplitude by $C_p$ and $TP_p$, it is not necessary to employ any sensor whatsoever to monitor the capacitive current component in a shockless type static eliminator, for example, as shown in U.S. Pat. No. 3,156,847, wherein each of the discharge electrodes is capacitively connected to the high voltage through a capacitance. That is, by picking off such a signal from a capacitively coupled electrode of a shockless static eliminator and generating a capacitive current signal similar to that of the embodiment shown in FIG. 6, there would no need to employ a separate capacitive current sensor, per se.

Figure 8:
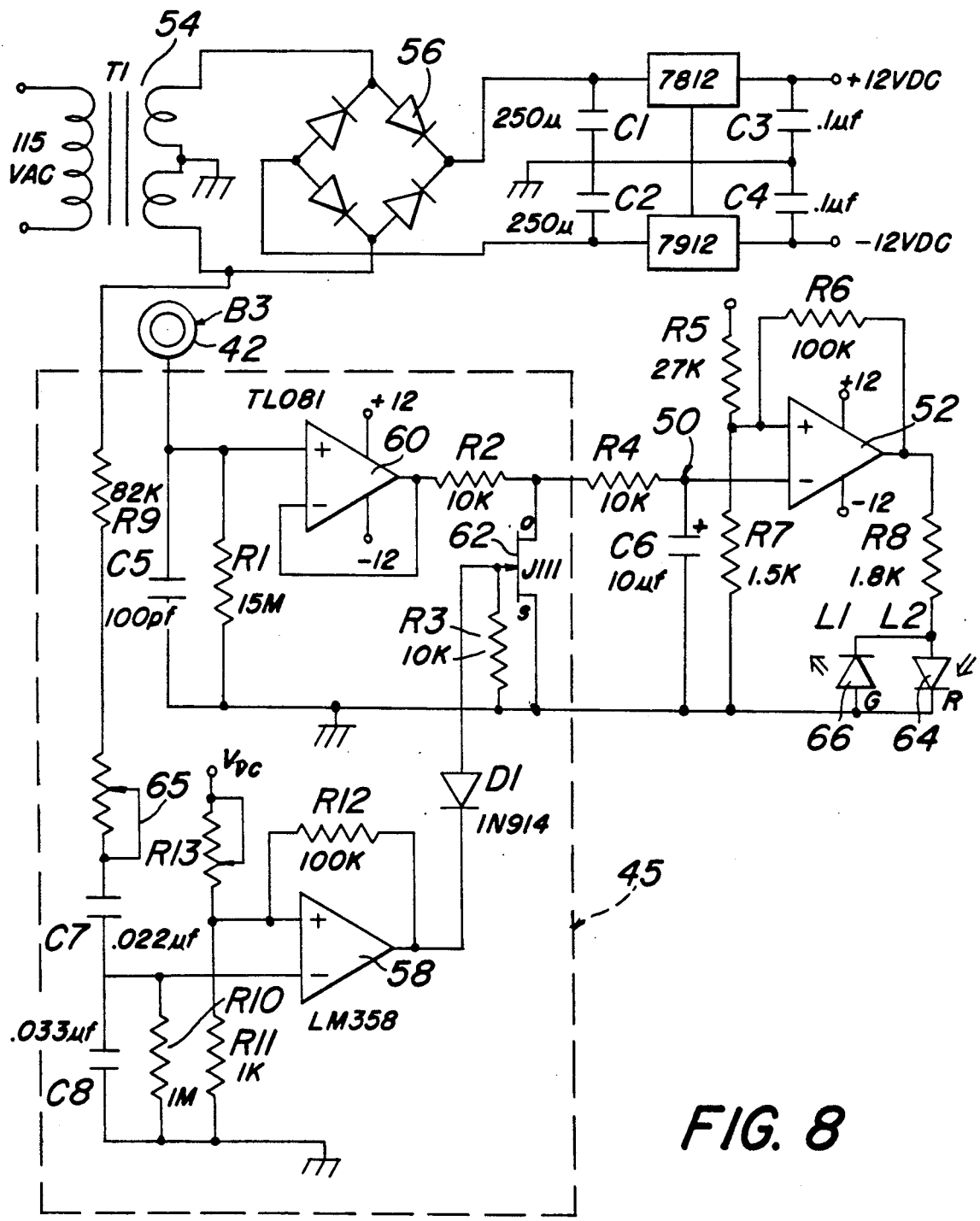
FIG. 8 is a schematic diagram illustrative of a further embodiment of the present invention wherein phase discriminator circuitry is utilized to isolate the corona current component from the total current.

Referring now to FIG. 8, a third mode of this invention isolates the corona current from the capacitive current by means of a phase discriminator circuit 45 (indentified by the portions of the circuit enclosed within dashed lines). In this arrangement, separation is accomplished without directly measuring the capacitive current as a separate component through use of one of the sensor embodiments, as shown in FIGS. 2 and 5 or without separately generating a capacitive current signal, as shown in FIG. 6. In this third mode, a single sensor B3 utilizing a ring-shaped element 42 applies a total current signal (i.e.—the sum of the capacitive and corona current components) to the input of the phase discriminator. The phase discriminator 45 passes only a portion of the signal with respect to time, namely that portion of each full cycle of the total current signal which contains equal positive and negative segments of the capacitive current component so that the average capacitive current signal equals zero.

Thus, after filtering, the capacitive current signal wave will be caused to cancel itself out and leave only that component proportional to corona current remaining. For example, when the portions of the signal passed by the phase discriminator are defined between each consecutive pair of positive and negative peaks of the capacitive signal wave form, the D.C. signal will primarily contain and be proportional to positive corona current. See FIG. 9. Conversely, when the selected portions are intermediate each consecutive pair of negative and positive peaks of the capacitive signal wave form, the D.C. signal will primarily contain and be proportional to negative corona current, as shown in FIG. 10.

When these selected portions of the phase discriminated signal are delivered through a filter 50, the positive and negative segments of the capacitive signal will cancel each other, leaving only the corona current constituent. As shown in FIG. 8, the corona current component is filtered by way of an R-C network (comprising 10K resistor R4 and 10 microfarad condenser C6), to produce a D.C. signal proportional to corona current. This D.C. level across capacitor C6 is applied to the negative input of comparator 52.

From FIG. 8, it may also be seen that (+) and (−)12 volt supply voltages for the various amplifiers and circuit components are developed by coupling 115 volt A.C. line voltage across center tapped step-down transformer 54 whose secondary is applied to full wave diode rectifier 56. The A.C. voltage at the secondary of the transformer 54 is also used as a timing signal in the operation of the phase discriminator circuit 45 by applying a portion of said voltage to the input of operational amplifier 58. The current sensed by ring sensor element 42 is delivered to the positive input of operational amplifier 60 which is connected as a voltage follower.

The portion of the signal passed through the phase discriminator is determined by the state of a field effect transistor (FET) 62, which state is controlled by the signal applied to its gate. This signal is generated by the output of comparator 58 which compares the voltage at the secondary of transformer 54 with respect to the voltage at the positive input terminal of op amp 58. The duty cycle of this signal can be varied by applying different bias to the positive input of opamp 58 via variable resistor R13.

The phase relationship between the signal derived from the voltage follower 60 and the signal at the gate of FET 62 can be adjusted by variable resistor 65 to obtain a null of the D.C. signal attributed to the capacitive current component. The D.C. signal is measured at the R-C filter 50 consisting of resistor R4 and capacitor C6. The signal to the gate of the FET 62 (acting as a chopper) can be reversed by connecting the resistor R9 to the other side of the secondary of transformer 54.

The output of comparator 52 actuates either a red LED 64 or a green LED 66 to indicate the status of the D.C. voltage at the negative input to said comparator. When the output voltage across capacitor C6 goes below a predetermined threshold level determined by the resistance divider R5 and R7, the LED indication will change from green to red, the comparator ratio being adapted to be modified to provide any desired level. A meter (not shown) can be connected across the condenser C6 to give a visual indication of the corona current level.

Figure 9:
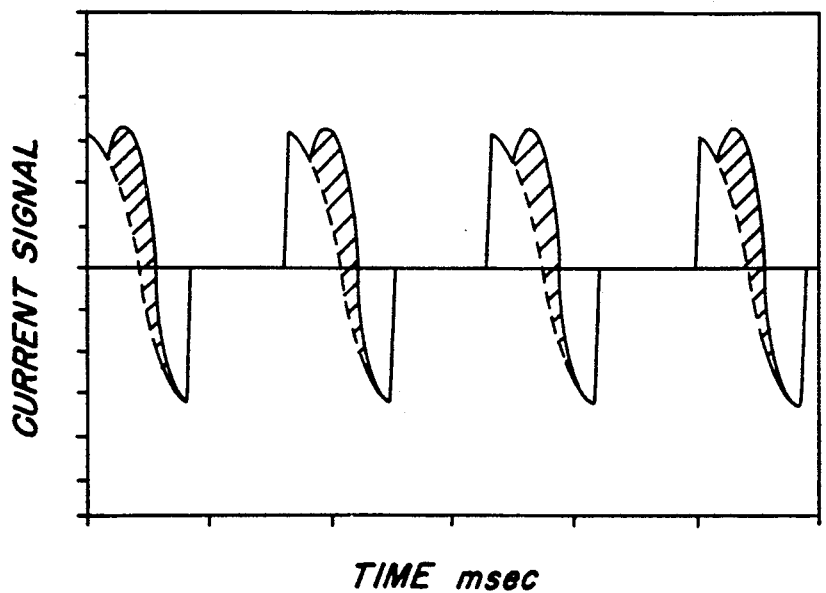
FIG. 9 is a graphical representation of a signal with respect to time appearing at the output of the phase discriminator configured to isolate the positive corona current.
Figure 10:
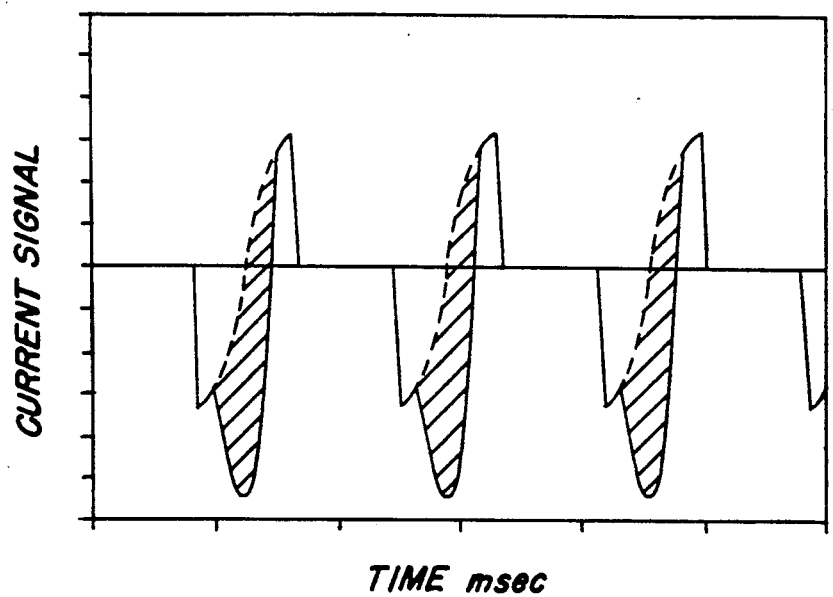
FIG. 10 is a graphical representation of a signal with respect to time appearing at the output of the phase discriminator configured to isolate the negative corona current.

The cross hatched areas of the curves in FIGS. 9 and 10 designate the recurring signals which, after filtering, will provide the respective positive or negative D.C. signals proportional to corona current. As set forth above, the phase discriminator circuit 45 which is coupled to the signal sensor B3 is so constructed and arranged as to pass just a selected portion of each full cycle of the A.C. total signal detected by said sensor. If an appropriate portion is passed through, the capacitive current component will cancel itself out and leave only an A.C. signal component related to corona current. It is necessary to select either one of the positive or negative current pulses in order to obtain a measure of what the corona current actually is.

By selecting those portions of the capacitive current signal wave form lying between each consecutive pair of positive and negative peaks, when filtered, the resulting D.C. signal will be related to positive corona current. Similarly, choosing those portions of the capacitive current signal wave form defined between each consecutive pair of negative and positive peaks, the filtered D.C. signal will be a measure of negative corona current.

Where the portion of the signal passed by the phase discriminator 45 is selected to be a 180° portion of the cycle lying between adjacent positive and negative peaks (or alternatively, corresponding negative and positive peaks) and having a zero average capacitive current component, the selected portion of the signal waveform will contain an entire positive (or negative) corona component. After filtering, the resultant D.C. signal will be proportional to positive (or negative) corona current depending upon the order of the consecutive peaks selected.

Where the portion of the cycle selected is less than 180° (but greater than 0°) while still having an average capacitive current component equal to zero, the selected portion of the signal waveform will contain a fractional part of the positive (or negative) corona current component so that the resultant D.C. signal after filtering will be related to the corresponding positive or negative corona current and a measure of the corona current level of the A.C. air ionizer.

As is apparent from the foregoing description, this invention can be utilized to monitor the corona current efficiency of any A.C. air ionizer. Because the discharge electrodes of such air ionizers are especially prone to the collection of dust and other contaminants by virtue of the strong electrical fields produced by such devices, the ability to monitor the ion current becomes extremely important in the operation thereof. That is, as these air ionizing devices become more and more contaminated, the corona current is caused to drop significantly and result in the diminution of the number of ions emitted at the electrodes with consequent inefficient static neutralization. By detecting the reduced amplitude of the ionizing current signal, the instant invention will provide an indication of the need to maintain the devices themselves.

Although this invention has been described in considerable detail, such description is intended as being illustrative rather than limiting, since the invention may be variously embodied without departing from the spirit thereof, and the scope of the invention is to be determined as claimed.

What is claimed is:

1. In combination with an air ionizer having at least one discharge electrode coupled to an A.C. high voltage power source and adapted to produce corona current at the discharge electrode comprising:

sensing means coupled to at least one discharge electrode for detecting total current of said at least one discharge electrode and developing an A.C. signal proportional to the sum of capacitive and corona current components generated at said electrode by the A.C. high voltage power source, means for electrically separating the capacitive current component from the corona current component in the total current signal, and means for monitoring the corona current component independently of the capacitive current component in order to determine the ion generating efficiency of the air ionizer.

2. The invention of claim 1 wherein said means for electrically separating the capacitive and corona current components comprises means for electrically subtracting the capacitive current component from the total current generated at said one electrode.

3. The invention of claim 1 wherein said means for electrically separating the capacitive current component from the corona current component comprises a pair of conductive sensing elements adjacently spaced from one discharge electrode, one sensing element developing an A.C. signal proportional to the sum of the capacitive and corona currents generated by the high voltage at said one electrode, the second of said sensing elements including means for obstructing the flow of corona current thereto, and means receiving the A.C. signals from said first and second sensing elements and electrically detecting the difference therebetween.

4. The invention of claim 3 wherein the pair of sensing elements are substantially identical in configuration and equidistantly spaced from said one discharge electrode, said means for obstructing the flow of corona current to the second sensing element comprising a layer of dielectric material interposed over said second sensing element.

5. The invention of claim 3 wherein a differential amplifier receives at opposing inputs thereof the signals from the respective sensing elements.

6. The invention of claim 5 including means for detecting and rectifying the output of said differential amplifier.

7. The invention of claim 1 wherein the means for electrically separating the capacitive and corona current components comprises a pair of sensing elements adjacently spaced from one discharge electrode, said discharge electrode being so constructed and arranged that one portion thereof will generate a first signal on one sensing element proportional to the sum of the capacitive and corona currents produced by the A.C. high voltage source on said discharge electrode while a second portion thereof will be prevented from generating corona current whereby said second sensing element will detect a second signal proportional to only capacitive current alone, and means constituting a differential amplifier receiving said first and second signals and providing an output proportional to the difference between the first and second signals.

8. The invention of claim 1 wherein the means for electrically separating the capacitive and corona current components comprises a pair of sensing elements, one sensing element being adjacently spaced from one discharge electrode and developing a first signal thereon proportional to the sum of the capacitive and corona currents produced by the A.C. high voltage source on said electrode at any time, the second sensing element being adjacently spaced from a second discharge electrode, said second electrode being so constructed and arranged as to prevent the generation of corona current at said second discharge electrode, whereby said second sensing element will detect a second signal proportional to only capacitive current along, and means constituting a differential amplifier receiving said first and second signals and providing an output proportional to the difference between the first and second signals.

9. The invention of claim 8 wherein the second discharge electrode has a radius of curvature sufficiently large as to prevent corona discharge therefrom whereby no generation of corona current at said second discharge electrode will occur when the high voltage is applied to the air ionizer.

10. The invention of claim 8 wherein a layer of dielectric material encapsulates the second discharge electrode so as to prevent corona discharge therefrom whereby flow of corona current to the second sensing element will not occur when high voltage is applied to the air ionizer.

11. The invention of claim 1 wherein said means for electrically separating the capacitive and corona current components comprises a sensing element adjacently spaced from one discharge electrode and developing a first signal thereon proportional to the sum of capacitive and corona currents produced by the A.C. high voltage source on said discharge electrode at any time, a differential amplifier having a first input receiving the first signal from said sensing element, means for generating a second signal from the air ionizer equal to the capacitive current in said first signal and in phase therewith, means for coupling said second signal to a second input of said differential amplifier, and means for electrically detecting the difference between the first and second signals.

12. The invention of claim 1 wherein said means for electrically separating the capacitive current component from the corona current component in the total current signal comprises an electrical circuit coupled to said sensing means, said electrical circuit being constructed and arranged so as to pass a selected portion of each full cycle of the current signal with respect to time generated by said sensing element, the portion selected containing equal positive and negative segments of the capacitive current component so as to yield a zero average capacitive current signal with respect thereto, and means for filtering the resultant output from said electrical circuit to provide a D.C. signal output.

13. The invention of claim 12 wherein said electrical circuit comprises a phase discriminator.

14. The invention of claim 13 wherein the selected portion of the current signal cycle passed by the phase discriminator contains a positive corona current component so that the D.C. signal is proportional to positive corona current component.

15. The invention of claim 13 wherein the selected portion of the current cycle passed by the phase discriminator contains a fractional part of the positive corona current component so that said D.C. signal relates to the positive corona current component.

16. The invention of claim 13 wherein the selected portion of the current signal cycle passed by the phase discriminator contains a negative corona current component so that said D.C. signal is proportional to the negative corona current component.

17. The invention of claim 13 wherein the selected portion of the current signal cycle passed by the phase discriminator contains a fractional part of the negative corona current component so that said D.C. signal relates to the negative corona current component.

18. The invention of claim 1 including phase discriminator means for passing a selective portion of each full cycle of the total current with respect to time so as to provide a zero average capacitive current component.

19. In combination with an air ionizer having at least one discharge electrode coupled to an A.C. high voltage power source and adapted to produce A.C. corona current at the discharge electrode, comprising:
    electrical sensing means coupled to at least one of said discharge electrodes for detecting total current of at least one electrode in said air ionizer and developing a first signal proportional to the sum of the capacitive and corona current components generated by the high voltage at said electrode,
    means for generating a second signal equal to the capacitive current component in said first signal and in phase therewith,
    means for electrically subtracting said second signal from the first signal, and
    means for measuring the difference between the two signals.

20. The invention of claim 19 wherein the means for generating a second signal equal to the capacitive current component comprises an electronic circuit coupled to the A.C. voltage operating said air ionizer.

21. The invention of claim 19 wherein the means for electrically subtracting the second signal from the first signal comprises a differential amplifier.

22. The invention of claim 21 wherein the means for generating a second signal equal to the capacitive current component comprises means for capacitively coupling a second discharge electrode of said air ionizer to an input of said differential amplifier.

23. In combination with an air ionizer having at least one discharge electrode coupled to an A.C. high voltage power source and adapted to produce corona current at the discharge electrode, comprising:
    sensing means coupled to at least one discharge electrode for detecting total A.C. current in said at least one discharge electrode of said air ionizer and developing an A.C. signal proportional to the sum of the capacitive and corona current components generated at said one discharge electrode,
    phase discriminator means coupled to said sensing means and being constructed and arranged so as to pass a selected portion of each full cycle of the A.C. signal with respect to time, which yields a zero average capacitive current component, and
    means for filtering the output from said phase discriminator means to provide a D.C. signal.

24. The invention of claim 23 wherein the portion of the signal passed by the phase discriminator means is intermediate each consecutive pair of corresponding positive and negative peaks of the capacitive current signal wave form and contains at least a portion of the positive corona current component so that the resultant D.C. signal is related to positive corona current.

25. The invention of claim 24 wherein a 180° portion of the signal is passed by the phase discriminator so that the selected portion of the signal waveform contains the entire positive corona current component and the resultant D.C. signal is proportional to the positive corona current.

26. The invention of claim 23 wherein the portions of the signal passed by the phase discriminator means are intermediate each consecutive pair of corresponding negative and positive peaks of the capacitive current signal wave form and contain at least a portion of negative corona current component so that the resultant D.C. signal is related to the negative corona current component.

27. The invention of claim 26 wherein a 180° portion of the signal is passed by the phase discriminator so that the selected portion of the signal waveform contains the entire positive corona current component and the resultant D.C. signal is proportional to negative corona current.

* * * * *